United States Patent [19]
Yokouchi et al.

[11] Patent Number: 5,426,755
[45] Date of Patent: Jun. 20, 1995

[54] SEMICONDUCTOR DEVICE INCLUDING CLOCK SELECTION CIRCUITRY SELECTING BETWEEN HIGH AND LOW FREQUENCY CLOCK SIGNALS FOR REDUCED POWER CONSUMPTION

[75] Inventors: Hideaki Yokouchi; Takashi Kimura, both of Nagano, Japan

[73] Assignee: Seiko Epson Corporation, Tokyo, Japan

[21] Appl. No.: 904,532

[22] Filed: Jun. 25, 1992

[30] Foreign Application Priority Data

Sep. 3, 1991 [JP] Japan .................................. 3-222980
Jun. 8, 1992 [JP] Japan .................................. 4-147571

[51] Int. Cl.$^6$ ...................... G06F 13/00; G06F 1/08; G11C 7/00
[52] U.S. Cl. ................................ 395/425; 365/227; 365/189.05; 365/208; 365/233; 364/707; 395/750; 395/550; 327/57
[58] Field of Search ................ 395/425, 750, 550; 364/707; 365/227, 233, 189.05, 208, 207; 307/530

[56] References Cited

U.S. PATENT DOCUMENTS

| | | | |
|---|---|---|---|
| 4,627,033 | 12/1986 | Hyslop et al. | 365/205 |
| 4,862,348 | 8/1989 | Nakamura | 395/425 |
| 4,881,205 | 11/1989 | Aihara | 365/233 |
| 5,086,387 | 2/1992 | Arroyo et al. | 395/550 |
| 5,261,082 | 11/1993 | Ito et al. | 395/550 |

FOREIGN PATENT DOCUMENTS 2-7296  1/1990  Japan .
4-106785  7/1992  Japan .

*Primary Examiner*—Glenn Gossage
*Attorney, Agent, or Firm*—Ladas & Parry

[57] ABSTRACT

A semiconductor device and an electronic apparatus with the semiconductor device incorporated therein, include a sense amplifier so that a storage device can be read at a high speed and at a low speed, whereby low power consumption may be realized driving low speed reading. When a high speed mode is set and a read instruction is given, the sense amplifier is driven to send out a signal of a bit line to a data bus through the sense amplifier, while when a low speed mode is set and a read instruction is given, a sense amplifier is brought into a non-driven state to send out a signal of a bit line to a data bus without going through the sense amplifier. The semiconductor device may also include a clock control circuit and a clock selection circuit for selecting a high frequency clock signal when the high speed mode is set and for selecting a low frequency clock signal when the low speed mode is set.

11 Claims, 8 Drawing Sheets

SEMICONDUCTOR DEVICE INCLUDING CLOCK SELECTION CIRCUITRY SELECTING BETWEEN HIGH AND LOW FREQUENCY CLOCK SIGNALS FOR REDUCED POWER CONSUMPTION

BACKGROUND OF THE INVENTION

The present invention relates to a semiconductor device including a storage device, and more particularly relates to the configuration of a circuit for reading data stored in the storage device.

A sense amplifier is used as a circuit for reading data stored in a storage device. The sense amplifier detects a very small potential difference between two opposite bit lines and evaluates the detected difference to "0" or "1" in order make the read speed high.

From the point of view of power consumption, the storage device reading circuit is not suitable for low speed reading operation while it is suitable for high speed reading operation. This is because the power consumed by the sense amplifier is the dominant power consumption during low speed reading operation, while the power consumed by the sense amplifier is not so large in comparison with the power consumed in the storage device during high speed reading. If a conventional circuit for reading a storage device is applied to, for example, a micro-computer system having two, high and low speed central processing unit (CPU) clocks, very much power is consumed by a sense amplifier even in the case of access to the storage device with the low speed clock.

SUMMARY OF THE INVENTION

It is an object of the present invention to provide a semiconductor device and an electronic apparatus containing the semiconductor device, in which a storage device can be read at a high speed and at a low speed, and low power consumption can be realized during low speed reading.

The semiconductor device according to an aspect of the present invention comprises a buffer circuit and a control circuit. The buffer control includes a differential amplifier for detecting a potential difference between a pair of signal lines, an intermediate potential control circuit for controlling the potential of each of the pair of signal lines to be an intermediate potential, a first data output means for sending out an output signal of the differential amplifier, and a second data output means for sending out a signal of one of the pair of signal lines. The control circuit brings the second output means into a non-driven state, and after driving the intermediate potential control circuit for a predetermined time, drives the differential amplifier and the first data output means so as to make the first data output means send out an output signal of the differential amplifier in the case where a high speed mode is set and a read instruction is given. In the case where a low speed mode is set and a read instruction is given, on the other hand, the control circuit brings the differential amplifier and the first data output means into a non-driven state, and drives the second data output means to send out a signal of one of the pair of signal lines. Therefore, at the time of reading in the low speed mode, data is read under the condition that the differential amplifier is in a non-driven state so that the differential amplifier consumes no power to thereby make it possible to save power. This pair of signal lines, for example, corresponds to bit lines of a random access memory (RAM) or read only memory (ROM).

Further, according to another aspect of the present invention the semiconductor device further comprises a data write means. The data write means transmits an input signal to one of the bit lines of a RAM and transmits an inverted signal to the input signal to the other bit line. Thus, the writing into the RAM is performed.

Further, according to another aspect of the present invention, in the semiconductor device, the control circuit brings the differential amplifier, the intermediate potential control circuit, and the first and second data output means into a non-driven state, while bringing the data input means into a driven state to write data into a RAM when a write instruction for writing in a high speed mode or a low speed mode is given.

Further, the semiconductor device according to another aspect of the present invention comprises a program command storage means, a central processing unit, a data storage means constituted by a RAM or a ROM, a buffer circuit, a control circuit, and a single semiconductor substrate on which the program command storage means, the central processing unit, the data storage means, the buffer circuit, and the control circuit are provided. The program command storage means stores program commands, and the central processing unit performs data processing, providing an output control signal in accordance with the program commands stored in the program command storage means. The data storage means outputs/receives data to/from the central processing unit. The buffer circuit and the control circuit have the same configurations as those described above and operate in the same manner as those described above.

Further, according to a further aspect of the present invention, the semiconductor device further comprises a clock selection circuit and a clock selection control circuit. The clock selection circuit receives clock signals having at least two kinds of low and high frequencies as reference clocks for driving the central processing unit, and outputs one of the clock signals as a clock signal of the central processing unit in accordance with an instruction of the clock selection control circuit. These two or more kinds of clock signals may be generated by a built-in oscillation circuit, or may be supplied from outside. If a high speed mode is set by the central processing unit, the clock selection control circuit causes the clock selection means to select a high frequency clock signal, while if a low speed mode is set, the clock selection control circuit causes the clock selection means to select a low frequency clock signal.

Further, the electronic apparatus according to a still further aspect of the present invention comprises such a semiconductor device as mentioned above, so that a high speed mode or a low speed mode can be selected, and the sense amplifier is arranged so as not to be driven when data is read in the case where the low speed mode is selected, so that it is possible to save power consumption.

The above and other objects as well as advantageous features of the present invention will become more clear from the following description taken in conjunction with the drawings.

DESCRIPTION OF THE PREFERRED EMBODIMENTS

Figure 1:
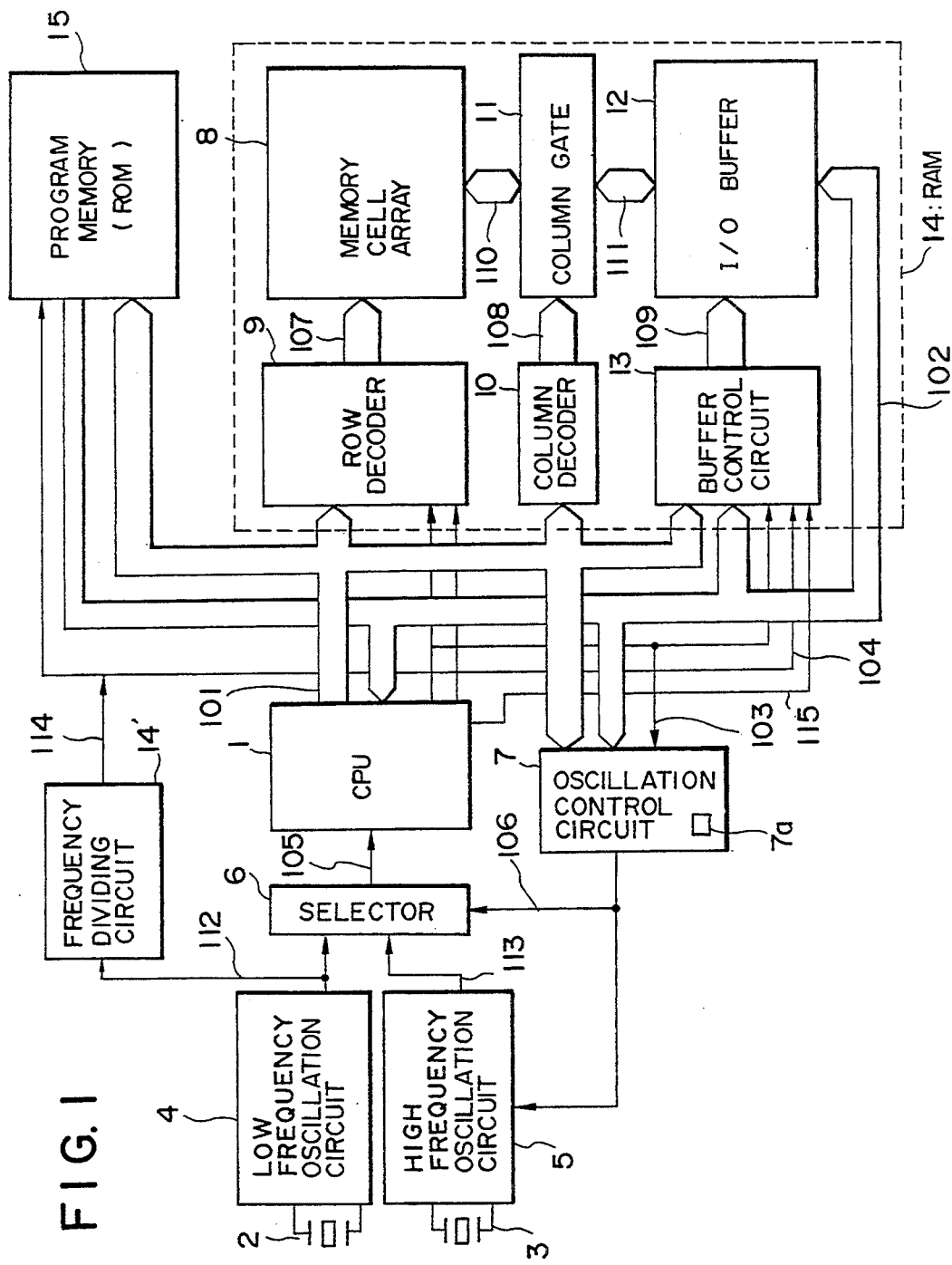
FIG. 1 is a block diagram illustrating the configuration of a semiconductor device according to an embodiment of the present invention.

FIG. 1 is a block diagram illustrating the configuration of a semiconductor device according to an embodiment of the present invention. This semiconductor device includes a CPU (central processing unit) 1. A crystal oscillator 2 of 32 KHz (for a low speed CPU clock) is made to oscillate by a low-frequency (LF) oscillation circuit 4, and a crystal oscillator 3 of 4 MHz (for a high speed CPU clock) is made to oscillate by a high-frequency (HF) oscillation circuit 5. Oscillation signals 112 and 113 of these oscillation circuits 4 and 5 are supplied to a selector 6. The selector 6 selects a high speed clock or a low speed clock for a CPU clock. An oscillation control circuit 7 controls the HF oscillation circuit 5 and the selector 6. A memory cell array 8 of a RAM 14 is connected to a row decoder 9 for decoding an address of a word line of the memory cell array 8, a column decoder 10 for decoding an address of a bit line, and a column gate 11 for selectively gating data on the bit line decoded by the column decoder 10. An input/output (I/O) buffer 12 is constituted by an 8-bit buffer for reading and writing data, and this I/O buffer 12 is controlled by a control signal 109 of a buffer control circuit 13. The RAM memory cell array 8, the row decoder 9, the column decoder 10, the column gate 11, the I/O buffer 12 and the buffer control circuit 13 constitute a RAM 14. A ROM 15 has a configuration fundamentally similar to that of the RAM 14 and a system program of the CPU 1 and various data are stored in the ROM 15.

The address for reading from and writing into the memory cell array 8 is obtained as follows. Ann address signal on an address bus 101 outputted from the CPU 1 is decoded by the row decoder 9 and the column decoder 10 to thereby obtain a row address signal 107 and a column address signal 108 respectively. A word line is selected by the row address signal 107, and the column gate 11 is controlled by the column address signal 108. A bit line is specified by the column gate 11 controlled by the column address signal 108, and the address of an 8-bit signal is specified by a plurality of bits of the selected word line and the specified bit line. Writing data is controlled by a write signal 103 outputted from the CPU 1, and reading data is controlled by a read signal 104 outputted from the CPU 1. A data bus 102 is used for transferring the writing/recording data.

The operation clock of the CPU 1 is decided by a CPU clock 105 outputted from the selector 6. The selector 6 is supplied with clocks outputted from the HF oscillation circuit 5 of 4 MHz and the LF oscillation circuit 4 of 32 kHz, so that the selector 6 outputs, as the CPU clock 105, one of the 4 MHz clock and the 32 kHz clock. The on/off of oscillation of the 4 MHz oscillation circuit 5 is controlled by an oscillation control signal 106 from the oscillation control circuit 7 in order to reduce power consumption. A 32 kHz clock 112 is supplied into a frequency dividing circuit 14' in addition to the selector 6, so that, for example, a timing signal 114 is formed by the frequency dividing circuit 14'.

Figure 2:
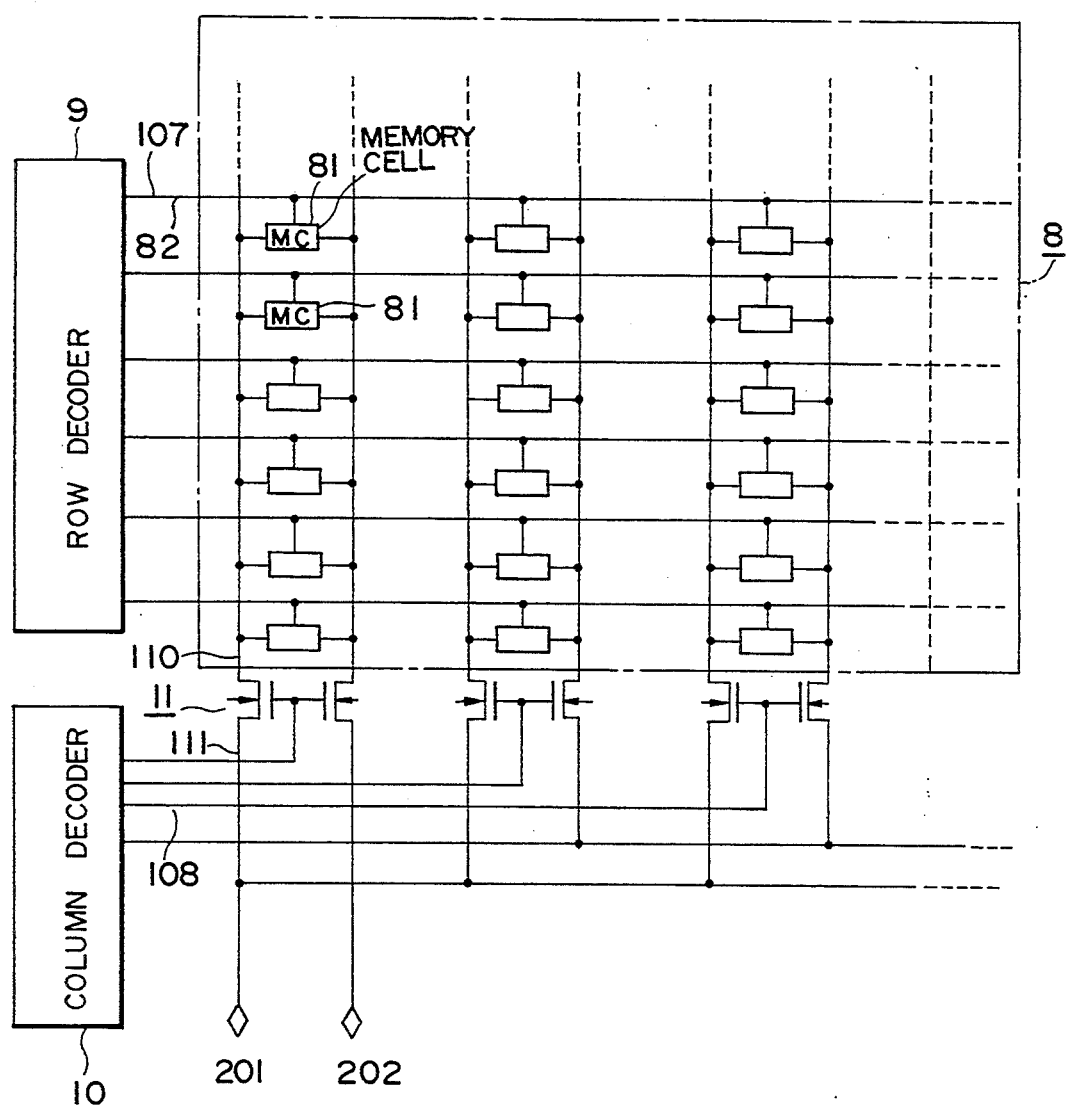
FIG. 2 is a circuit diagram illustrating in detail a memory cell array of FIG. 1 and the periphery thereof.

FIG. 2 is a diagram illustrating in detail the memory cell array 8 and its peripheral circuits. The memory cell array 8 has memory cells 81 arranged in a matrix as shown in FIG. 2, and one of the word lines 82 is selected by the select signal 107 from the row decoder 9. The column gate 11 is controlled by the column address signal 108 from the column decoder 10 to thereby select a bit line. Hereunder, the case where bit lines 201 and 202 have been selected will be described.

Figure 3:
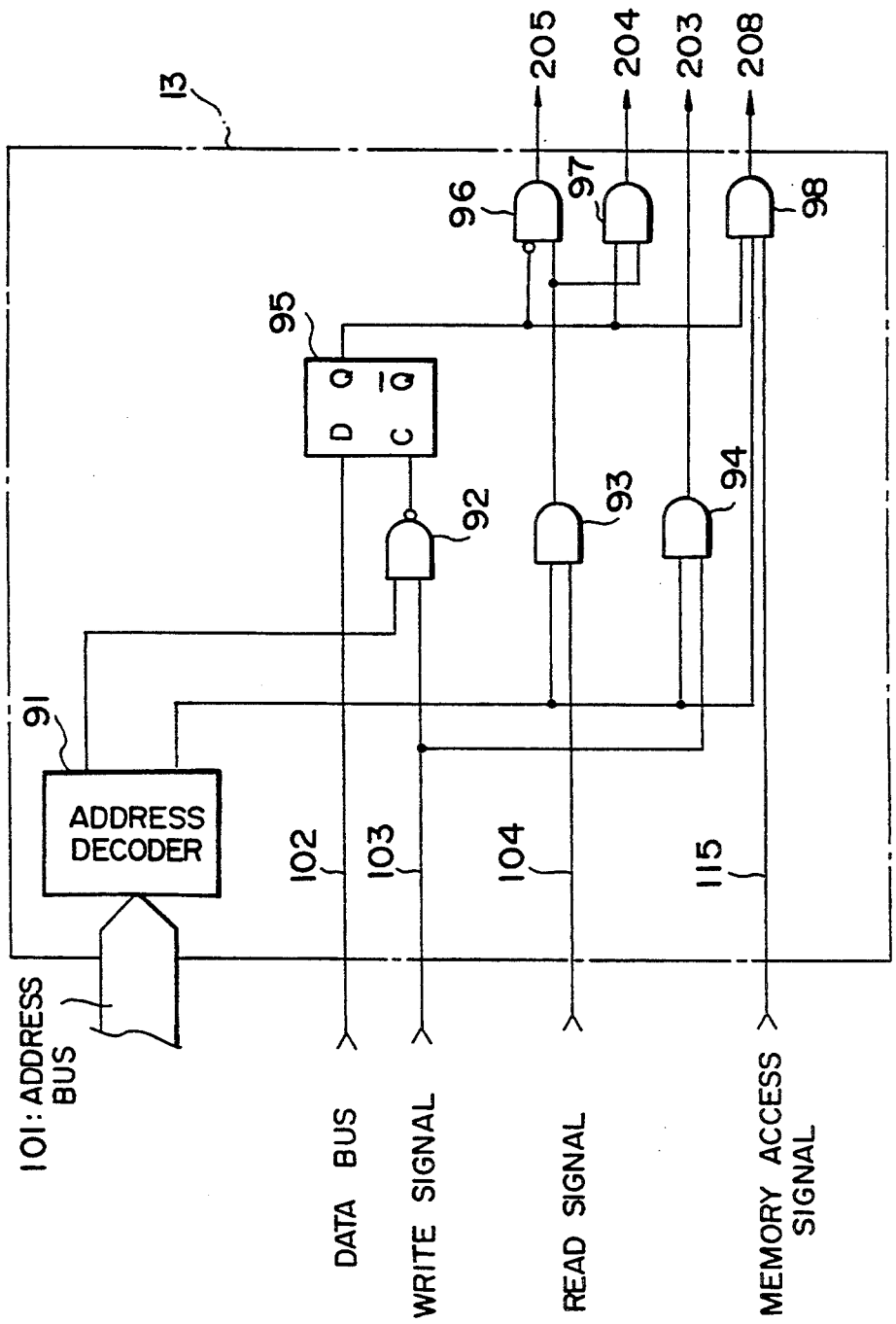
FIG. 3 is a circuit diagram illustrating in detail a buffer control circuit of FIG. 1.

FIG. 3 is a diagram illustrating in detail the buffer control circuit 13. A RAM address is allocated to the buffer control circuit 13, and an address decoder 91 decodes an address signal on the address bus 101. This decoded signal is transmitted, as a gate signal, to NAND gate 92 and AND gates 93 and 94. A 1-bit signal on the data bus 102 is supplied to an operation mode switching register 95 which latches the signal. For example, "1" is set in a high speed mode, and "0" is set in a low speed mode. The write signal 103 is supplied to the gates 92 and 94 NAND gate 92 and AND gates 93 and 94. The write signal 103 supplied to AND gate 94 is output from the AND gate 94 as a control signal 203.

The output of the operation mode switching register 95 is supplied, as a gate signal, to AND gates 96 to 98. The read signal 104 is supplied to the AND gate 96 through the AND gate 93, and the output of the AND gate 96 is a control signal 205. The read signal 104 is also supplied to the AND gate 97 through the AND gate 93, and the output of the AND gate 97 is a control signal 204. The AND gate 98 is supplied with a memory access signal 115 and the respective outputs, as gate signals, of the address decoder 91 and the operation mode switching register 95, and the output of the AND gate 98 is a control signal 208.

Figure 4:
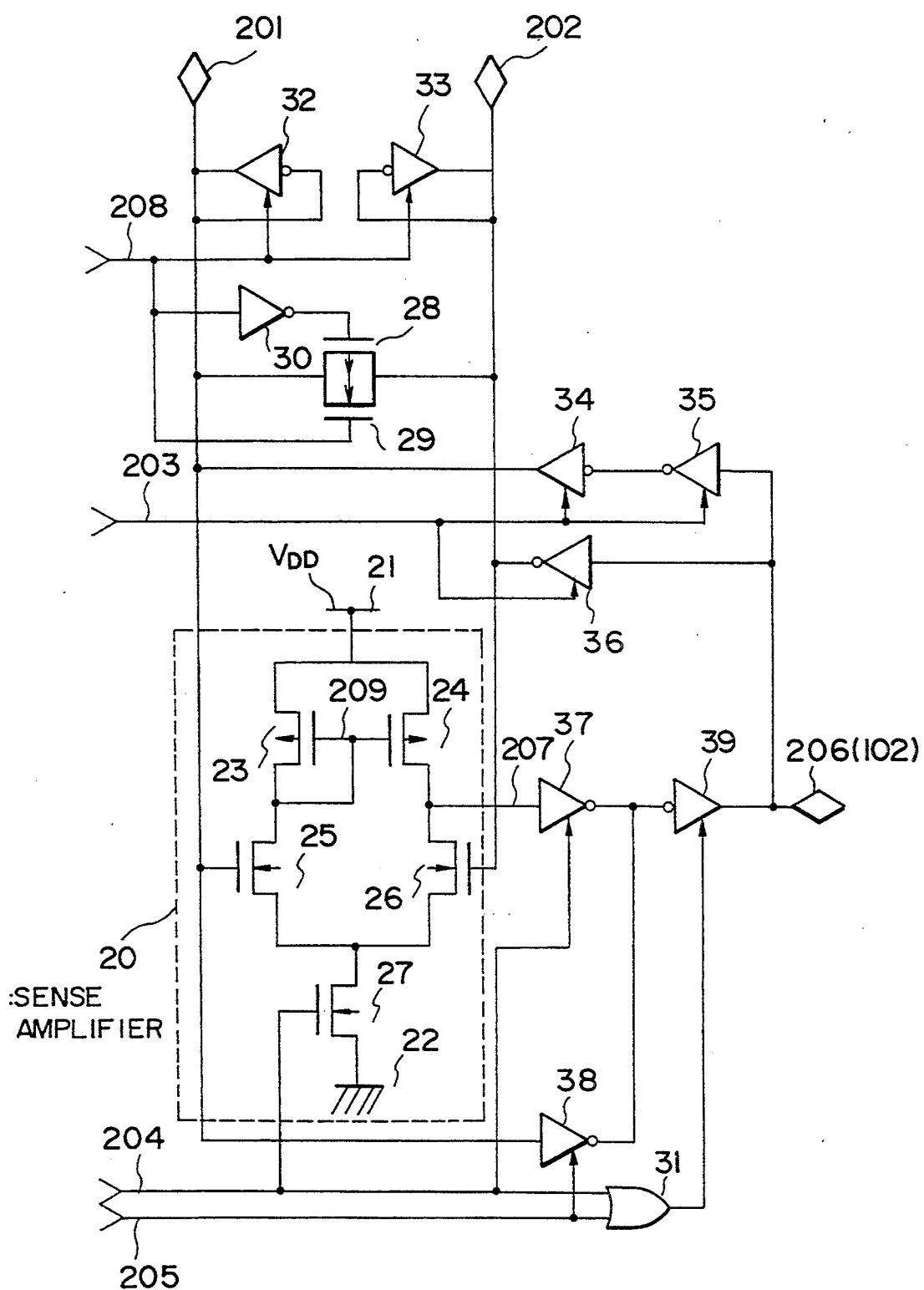
FIG. 4 is a circuit diagram illustrating an input/output buffer of the semiconductor device of FIG. 1.

FIG. 4 is a circuit diagram illustrating in detail one bit of the I/O buffer 12 in FIG. 1. Clocked inverters 32 and 33 control the bit lines 201 and 202 to be at the intermediate voltage level. A P channel metal oxide semiconductor (PMOS) transistor 28 and an N channel metal oxide semiconductor (NMOS) transistor 29 control the potentials of the bit lines 201 and 202 to be equal to each other, that is, to be at an intermediate voltage level of the power supply voltage. An inverter 30 is supplied with the control signal 208, and an OR circuit 31 is supplied with the control signals 204 and 205. In this manner, clocked inverters 32 and 33, and transistors 28 and 27 along with inverter 30, act as an intermediate potential control circuit. A positive power supply (VDD) 21 and a negative power supply (VSS) 22 are connected to a sense amplifier 20. P channel metal oxide semiconductor (PMOS) transistors 23 and 24 constitute a current mirror circuit of the sense amplifier 20, and N channel metal oxide semiconductor (NMOS) transistors 25 and 26 constitute a differential input stage of the sense amplifier 20. An NMOS transistor 27 controls the on/off state of the sense amplifier 20, and controls the source potentials of the NMOS transistors 25 and 26. Clocked inverters 34 and 35 transfer the data of the data bus 206 onto the bit line 201 at the time of data writing.

A clocked inverter 36 transfers an inverted signal of the data of the data bus 206 onto the bit line 202 at the time of data writing. A clocked inverter 37 transfers an output data 207 of the sense amplifier 20 to a clocked inverter 39 at the time of data reading. A clocked inverter 38 sends out a signal from the bit line 201 to clocked inverter 39. The clocked inverter 39 transfers the output data of the clocked inverters 37 and 38 onto the data bus 206. Inverter 37 thus functions as a first data output means and inverter 38 functions as a second data output means.

Figure 5:
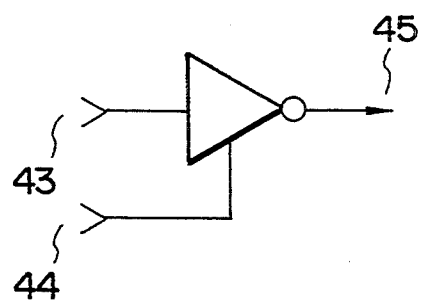
FIG. 5 is a circuit diagram illustrating a clocked invertor.
Figure 6:
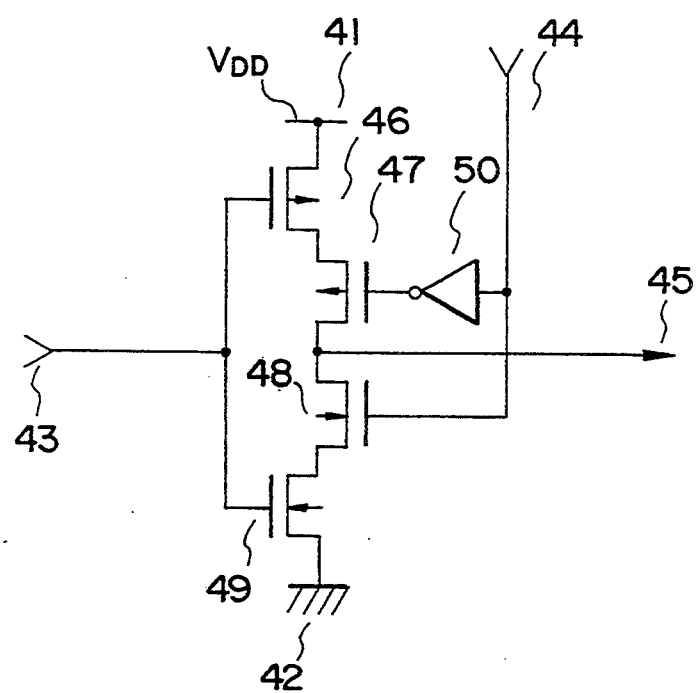
FIG. 6 is a circuit diagram illustrating in detail the clocked invertor.

FIG. 5 is a diagram illustrating one of the clocked invertors 32 to 39, and FIG. 6 is a circuit diagram illustrating an inside circuit of the clocked inverter of FIG. 5. The VDD 41 and the VSS 42 are connected to this clocked inverter. Supplied with a data input 43 and a clock input 44, this clocked inverter outputs a data output 45. This clocked inverter is constituted by PMOS transistors 46 and 47, NMOS transistors 48 and 49 and an invertor 50 connected in a manner as illustrated. If the clock input 44 is in a low level (hereinafter abbreviated to "L level"), the data output 45 is brought into a high impedance state, and if the clock input 44 is in a high level (hereinafter abbreviated to "H level"), the data output 45 outputs inverted data of the input data of the data input 43.

Next the operation of the semiconductor device of the above-mentioned embodiment will be described. As mentioned above, the I/O buffer 12 has two operation modes, a high speed operation mode and a low speed operation mode, for each of a read operation and a write operation. Therefore, the I/O buffer 12 has four operations, reading at a high speed, writing at a high speed, reading at a low speed, and writing at a low speed. The semiconductor device shown in FIG. 2 includes the two oscillation circuits 4 and 5 of 4 MHz and 32 kHz as mentioned above, and constitutes a twin clock microcomputer capable of selecting one of the respective outputs of those oscillation circuits 4 and 5 as the CPU clock 105. Switching of the clock is controlled by "1" or "0" which is written, by the CPU 1, into a register 7a incorporated in the oscillation control circuit 7. In the case of making access to the RAM in the high speed mode, therefore, the CPU clock 105 is switched to 4 MHz by the oscillation control circuit 7 in advance before selecting the address of the RAM 14 and making access thereto. In the case of making access in the low speed mode, on the other hand, the CPU clock 105 is switched to 32 kHz by the oscillation control circuit 7 in the same manner. The RAM 14 is accessed in this manner.

Figure 7:
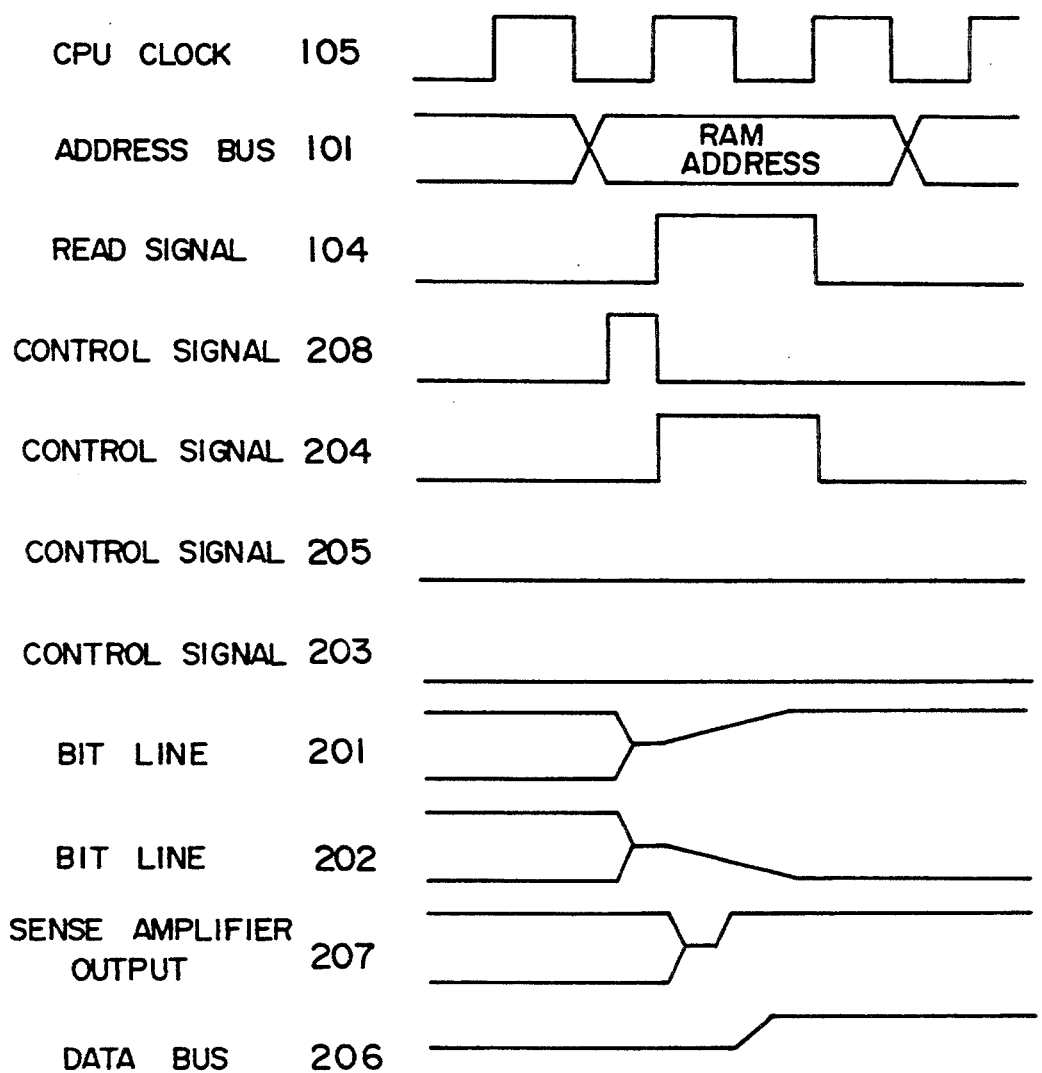
FIG. 7 is a timing chart of a reading operation in a high speed operation mode.

FIG. 7 is a timing chart for the read operation in the high speed operation mode. As shown in FIG. 7, the control signal 208 is at the high (H) level after the address of the RAM is selected by the CPU 1 until the read signal 104 is brought to the H level, so that the potentials of the bit lines 201 and 202 are at the intermediate voltage level. That is, both the inputs and outputs of the clocked inverters 32 and 33 are connected to the bit lines 201 and 202, respectively, and the potentials thereof are stabilized at a voltage level of half of the power supply voltage $V_{DD}$. At this time the PMOS transistors 46 and 47 and the NMOS transistors 48 and 49, constituting the clocked inverters 32 and 33, have the same characteristics. Further, since the intermediate level potentials of the bit lines 201 and 202 vary if the characteristics of the transistors constituting the clocked inverters 32 and 33 vary, the PMOS transistor 28 and the NMOS transistor 29 are turned on by the control signal 208 so that the potentials of the bit lines 201 and 202 are equal to each other.

After that, the control signal 208 takes the L level synchronously with the read signal 104 from the CPU 1, so that the PMOS transistor 28, the NMOS transistor 29 and the clocked invertors 32 and 33 are turned off. Further, the control signal 204 takes the H level at the same time, so that the sense amplifier 20 and the clocked inverters 37 and 39 are turned on.

The sense amplifier 20 is constituted by the PMOS transistors 23 and 24 and the NMOS transistors 25 to 27, and the PMOS transistors 23 and 24 and the NMOS transistors 25 and 26 are of the same configuration so as to have equivalent characteristics respectively. The NMOS transistor 27 is to control the operation current of the sense amplifier 20, and the response speed of the sense amplifier 20 also depends on the value of the current flowing into this transistor. In order to operate the sense amplifier 20, first, the potentials applied to the respective gates of the NMOS transistors 25 and 26 are made equal to each other, so that currents flowing into the PMOS transistors 23 and 24 and the NMOS transistors 25 and 26 are made equal to each other. After that, the respective potentials applied to the gates of the NMOS transistors 25 and 26 change, so that the value of the current flowing into the PMOS transistor 23 and the NMOS transistor 25 and the value of the current flowing into the PMOS transistor 24 and the NMOS transistor 26 change, and the potential of the output 207 is determined. That is, if the gate potential of the NMOS transistor 25 is higher than the gate potential of the NMOS transistor 26, the output 207 becomes H level, and in the contrary case, the output 207 becomes L level.

In this embodiment, as shown in FIG. 6, the bit lines 01 and 202 are made to be at the same potential equal to the intermediate voltage level by the transistors 28 and 29 and the clocked inverters 32 and 33. Thereafter, memory data of the address designated by the CPU 1 is outputted onto the bit line 201, and inverted data thereof is outputted onto the bit line 202. The sense amplifier 20 detects the potential difference between the bit lines 201 and 202, and outputs the read data to the data bus 206 through the clocked inverters 37 and 39 at a high speed (4 MHz). Further, the control signal 205 is in the L level in this mode, so that the clocked inverters 38 is in the off state.

Figure 8:
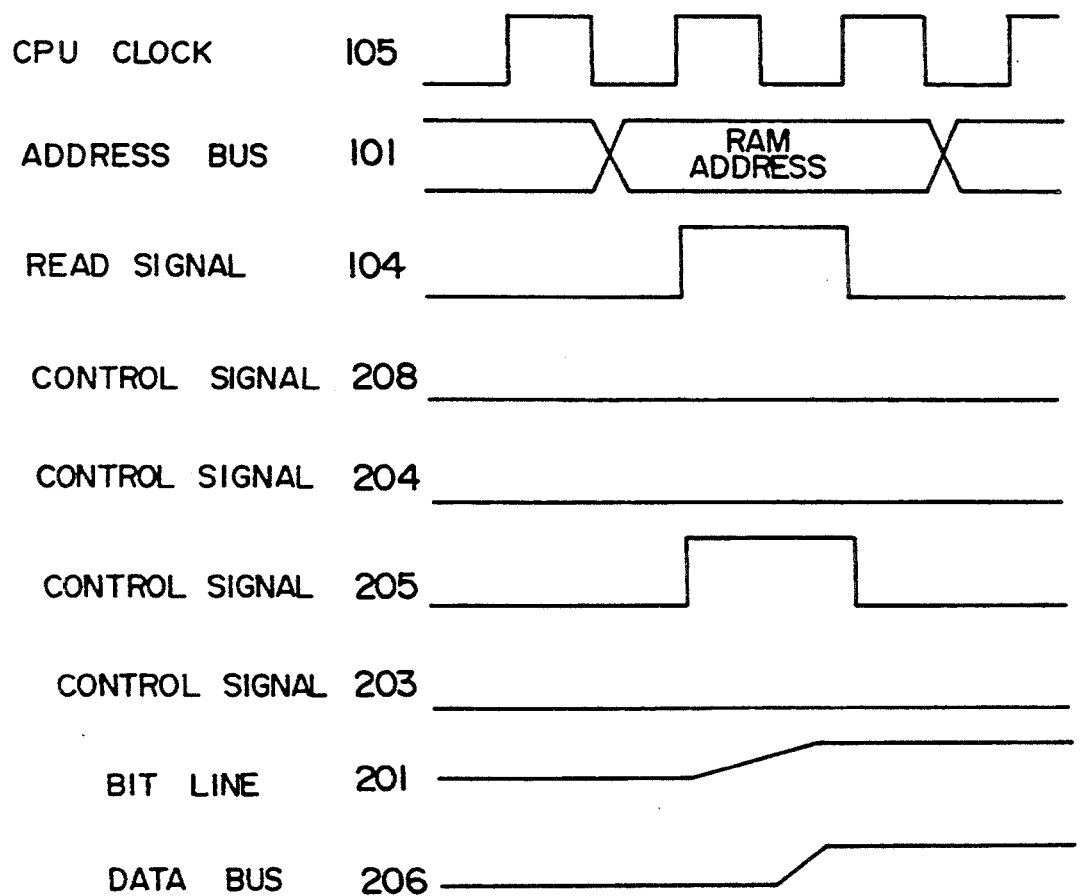
FIG. 8 is a timing chart of a reading operation in a low speed operation mode.

FIG. 8 is a timing chart for the read operation in a low speed operation mode. In this mode, the control signals 208 and 204 are always in the L level, so that the circuit elements which cause the sense amplifier 20 and the bit lines 201 and 202 to be at the intermediate voltage level, that is, the transistors 28 and 29 and the clocked inverters 32 and 33, are always in the off state, and also the sense amplifier 20 is always in the off state. Therefore, there is no path to allow a current to normally pass in this mode, so that power consumption can be reduced. In the case of reading in this mode, the control signal 205 becomes the H level synchronously with the read signal 104, so that the clocked inverters 38 and 39 operate, the potential of the bit line 201 is read through those clocked inverters at a low speed (32 kHz), and the read data is transmitted through the data bus 206.

Next, the data writing operation will be described simply. The control signals 204, 205 and 208 are in the L level at the time of writing data into the RAM 14, and the control signal 203 takes the H level synchronously with the write signal 103 outputted from the CPU 1, whereby the clocked inverters 34 to 36 operate, a signal from the data bus 206 is supplied onto the bit line 201 through the clocked inverters 34 and 35, and an inverted signal thereof is supplied onto the bit line 202 through the clocked inverter 36. Such a data writing operation is performed at a high speed (4 MHz) when the high speed mode is selected, and at a low speed (32 kHz) when the low speed mode is selected.

As has been described above, in the case of making access for reading in the low speed mode, the sense amplifier 20 and the clocked inverters for setting the bit lines to the intermediate voltage level are not driven, so that current consumption by those elements can be eliminated.

Here, power consumption will be discussed by way of a specific example. Assume that a current consumed by the sense amplifier 20 of the I/O buffer 12 is 100 milliamps (mA), the RAM is accessed 1,000 times per second with the clock of 4 MHz in the high speed mode, and 1,000 times per second with the clock of 32 kHz in the low speed mode. If one access to the RAM is made with the clock of 4 MHz, the on-period of the sense amplifier 20 is 250 nanoseconds (nsec), while if one access to the RAM is made with the clock of 32 kHz, the on-period of the sense amplifier 20 is 31 microseconds ($\mu$sec). Therefore, in a conventional circuit having no mode for turning off the sense amplifier 20, the sense amplifier 20 is turned on for about 31.25 milliseconds (msec) per second, and the current consumption is about 3 mA. On the other hand, in the case of using a data read circuit as mentioned in the above embodiment, since the sense amplifier 20 is driven at the time of making access in the low speed mode (32 kHz), the sense amplifier 20 is turned on for only 0.25 msec per second. It is therefore possible to reduce current consumption to 0.025 mA, so that it is possible to remarkably reduce power consumption in comparison with a conventional circuit.

Figure 9:
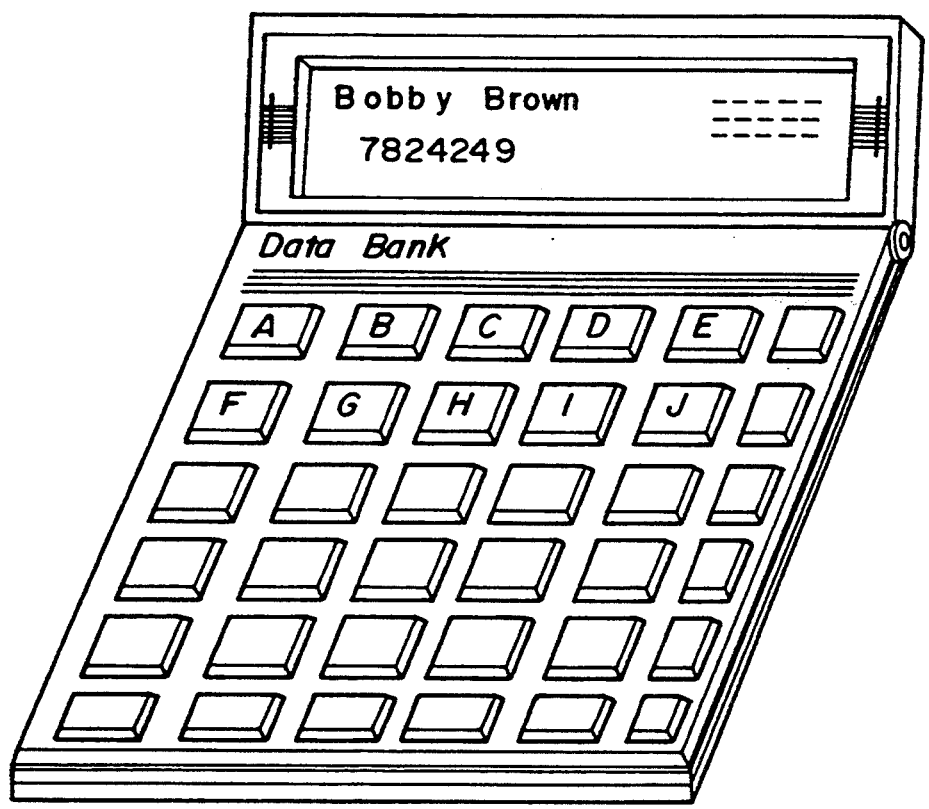
FIG. 9 is a perspective view illustrating an electronic apparatus to which the semiconductor device of FIG. 1 is applied.

The low speed mode is used for low speed data processing, such as a timing operation. In the case of the low speed mode, the low frequency (LF) oscillation circuit 4 is selected while the oscillation of the high frequency (HF) oscillation circuit 5 is turned off at the same time to thereby reduce power consumption. When it is necessary to perform high speed processing the mode is switched to the high speed mode so that the HF oscillation circuit 5 is used. For example, in such a system as an electronic notebook shown in FIG. 9, processing such as a timing operation is performed in a low speed operation mode, and processing such as data processing or calculation functions is performed in a high speed operation mode, so that it is possible to reduce power consumption.

Although the present invention has been described in the above-mentioned embodiment for a RAM, the present invention may be applied to various memories (for example, the ROM 15), decoders, etc. The respective circuits used in the above mentioned embodiment can be modified within the scope of the objects of the present invention.

As is apparent from the above-mentioned embodiment, it is possible to access data with a selected one of high and low speed clocks, and it is possible to reduce power consumption at the time of making access to data with the low speed clock. Particularly in the case where the present invention is used in a twin clock microcomputer having two CPU clocks for high and low speeds, or in an electronic system using such a twin clock microcomputer having two CPU clocks, the reduction in power consumption is very remarkable.

What is claimed is:

1. A semiconductor device comprising;
    a buffer circuit including a differential amplifier for detecting a potential difference between a pair of signals lines connected to memory cells, an intermediate potential control circuit for controlling a potential of each of said pair of signal lines to be at an intermediate potential, a first data output means for sending out an output signal of said differential amplifier, and a second data output means for sending out a signal of one of said pair of signal lines; and
    a control circuit having a first register means for providing a mode signal, for bringing said second output means into a non-driven state, and after driving said intermediate potential control circuit for a predetermined time, driving said differential amplifier and said first data output means, said first data output means sending out an output signal of said differential amplifier when a high speed mode is set in said first register means and a read instruction for reading out a signal of said pair of signal lines is received, said control circuit bringing said differential amplifier and said first data output means into a non-driven state, and driving said second data output means to send out a signal of said one of said pair of signal lines when a low speed mode is set in said first register means and said read instruction is received.

2. A semiconductor device according to claim 1, further comprising a data write means for inputting an input signal into one of said pair of signal lines, and inputting an inverted signal of said input signal into the other of said pair of signal lines.

3. A semiconductor device according to claim 2, wherein said control circuit brings said differential amplifier, said intermediate potential control circuit, said first and second data output means into a non-driven state, and brings said data write means into a driven state, when a write instruction for writing an input signal into one of said memory cells is input.

4. A semiconductor device according to claim 3, wherein said signal lines are bit lines of a random access memory.

5. A semiconductor device according to claim 3, wherein said signal lines are bit lines of a read only memory.

6. A semiconductor device comprising:
    a program command storage means for storing program commands;
    a central processing unit for processing data and outputting a control signal in accordance with said program commands stored in said program command storage means;
    a data storage means for providing output data to said central processing unit;
    a buffer circuit including a sense amplifier for detecting a potential difference between a pair of bit lines of said data storage means, an intermediate potential control circuit for controlling a potential of each of said pair of bit lines to be at an intermediate potential, a first data output means for sending out an output signal of said sense amplifier, and a second output means for sending out a signal of one of said pair of bit lines; and a control circuit having a first register means for providing a mode signal, for bringing said second output means into a non-driven state, and after driving said intermediate potential control circuit for a predetermined time, driving said sense amplifier and said first data output means, said first data output means sending out an output signal of said sense amplifier when a high speed mode is set in said first register means and a read instruction for reading out a signal of said pair of bit lines is received, said control circuit bringing said sense amplifier and said first data output means into a non-driven state, and driving said second data output means to send out a signal of said one of said pair of bit lines when a low speed mode is set in said first register means and said read instruction is received;

wherein said program command storage means, said central processing unit, said data storage means, said buffer circuit and said control circuit are provided on a single semiconductor substrate.

7. A semiconductor device according to claim 6, wherein said data storage means comprises a random access memory.

8. A semiconductor device according to claim 6, further comprising;

a clock selection circuit for receiving clock signals, having both high and low frequencies, for providing one of said clock signals as a clock signal for driving said central processing unit, and an oscillation control circuit having a second register means for providing a mode signal, said oscillation control circuit causing said clock selection circuit to select a high frequency clock signal when a high speed mode is set in said second register means, and causing said clock selection means to select a low frequency clock signal when a low speed mode is set in said second register means.

9. A semiconductor device according to claim 6, wherein said data storage means comprises a read only memory.

10. An electronic apparatus comprising a semiconductor device, said semiconductor device including:

a buffer circuit including a differential amplifier for detecting a potential difference between a pair of signal lines connected to memory cells, an intermediate potential control circuit for controlling a potential of each of said pair of signal lines to be at an intermediate potential, a first data output means for sending out an output signal of said differential amplifier, and a second data output means for sending out a signal of one of said pair of signal lines; and a control circuit having a first register means for providing a mode signal for bringing said second output means into a non-driven state, and after driving said intermediate potential control circuit for a predetermined time, driving said differential amplifier and said first data output means, said first data output means sending out an output signal of said differential amplifier when a high speed mode is set in said first register means and a read instruction for reading out a signal of said pair of signal lines is received, said control circuit bringing said differential amplifier and said first data output means into a non-driven state, and driving said second data output means to send out a signal of said one of said pair of signal lines when a low speed mode is set in said first register means and said read instruction is received;

wherein said low speed mode is utilized in the case of a timing operation and said high speed mode is utilized in the case of data processing or calculation.

11. An electronic apparatus comprising a semiconductor device, said semiconductor device including:

a program command storage means for storing program commands;

a central processing unit for processing data and outputting a control signal in accordance with said program commands stored in said program command storage means;

a data storage means for providing output data to said central processing unit;

a buffer circuit including a sense amplifier for detecting a potential difference between a pair of bit lines of said data storage means, an intermediate potential control circuit for controlling a potential of each of said pair of bit lines to be at an intermediate potential, a first data output means for sending out an output signal of said sense amplifier, and a second data output means for sending out a signal of one of said pair of bit lines; and a control circuit having a first register means for providing a mode signal for bringing said second output means into a non-driven state, and after driving said intermediate potential control circuit for a predetermined time, driving said sense amplifier and said first data output means, said first data output means sending out an output signal of said sense amplifier when a high speed mode is set in said first register means and a read instruction for reading out a signal of said pair of bit lines is received, said control circuit bringing said sense amplifier and said first data output means into a non-driven state, and driving said second data output means to send out a signal of one of said pair of signal lines when a low speed mode is set and a read instruction is received;

said program command storage means, said central processing unit, said data storage means, said buffer circuit and said control circuit being provided on a single semiconductor substrate;

wherein said low speed mode is utilized in the case of a timing operation and said high speed mode is utilized in the case of data processing or calculation.

* * * * *